United States Patent [19]

Streckmann

[11] Patent Number: 4,535,300

[45] Date of Patent: Aug. 13, 1985

[54] EXTENDED RANGE SAMPLE AND HOLD CIRCUIT

[75] Inventor: George L. Streckmann, Dallas, Tex.

[73] Assignee: Texas Instruments Incorporated, Dallas, Tex.

[21] Appl. No.: 504,334

[22] Filed: Jun. 14, 1983

[51] Int. Cl.³ .............................................. H03G 3/10
[52] U.S. Cl. .................................... 330/279; 307/353; 328/151; 330/51
[58] Field of Search ................ 307/352, 353; 328/151; 330/51, 141, 181, 279; 367/65, 66, 67

[56] References Cited

U.S. PATENT DOCUMENTS

| | | | |
|---|---|---|---|
| 3,525,948 | 8/1970 | Sherer et al. | 330/51 |
| 3,875,516 | 4/1975 | Thomas | 328/151 X |
| 4,282,515 | 8/1981 | Patterson, III | 307/352 X |

Primary Examiner—James B. Mullins
Assistant Examiner—Steven J. Mottola
Attorney, Agent, or Firm—Thomas G. Devine; Leo N. Heiting; Melvin Sharp

[57] ABSTRACT

An extended range sample and hold circuit for use in systems such as floating point amplifiers is disclosed. An input differential amplifier receives a varying analog signal which is passed by a transistor sample switch during a predetermined sample period to an integrating differential amplifier having a sample capacitor across its output and inverting input. The charge on the sample capacitor follows the input analog signal. The output of the integrating differential amplifier is connected to a nonlinear circuit which in turn is connected to the noninverting input of an output differential amplifier. The nonlinear circuit provides a resistive path for small signals so that a fraction of the voltage across the sample capacitor is presented at the input to the output differential amplifier. As the signal becomes larger, a nonlinear portion of the circuit provides a signal at the input to the output differential amplifier that approaches the charge on the sample capacitor at one extreme. As the signal becomes smaller, it approaches the fractional portion at the other. The output amplifier provides a feedback loop to the input amplifier.

Also, a transistor switch identical to the transistor sample switch is connected to a capacitor identical to the sample capacitor and connected to the noninverting input of the integrating differential amplifier to assure that transistor switch capacitance charge transfer is equal on the inverting and noninverting inputs of the integrating differential amplifier.

20 Claims, 7 Drawing Figures

EXTENDED RANGE SAMPLE AND HOLD CIRCUIT

BACKGROUND OF THE INVENTION

1. Field of the Invention

This invention pertains to sample and hold circuits and more particularly to a sample and hold circuit having a nonlinear circuit, together with the sample capacitor, in a feedback loop to provide an extended range of input voltage amplitude capability.

2. Description of the Prior Art

When a sample is taken of a varying signal, a sample and hold circuit is used to capture a sample of the signal and to hold it for measuring or other purposes. The widest use of the sample and hold circuit is with high speed approximation analog to digital converters as part of floating point amplifiers.

The prior art sample and hold circuits used in these applications generally have a differential amplifier input stage having 100% inverse feedback, a sample transistor switch connected to a sample capacitor and to an output differential amplifier having 100% inverse feedback. The transistor switch is closed for a period of time allowing the input analog signal, applied to the input amplifier to charge the sample capacitor. When the transistor sample switch is opened, the sample is held with the output of the output amplifier representing the sample of the input analog signal. The output differential amplifier provides a very high input impedance to prevent discharging the sample capacitor. Any current required by the output amplifier must be extremely small because it will gradually change the charge on the capacitor. Leakage resistance in the component layout, internal leakage resistance of the capacitor, presence of moisture, etc. are factors that limit the length of time that the capacitor can accurately hold the charge. The sample capacitor is not in a feedback loop. The "on" resistance of the switch and any offset error in the output amplifier will cause an error in the output.

An improved prior art sample and hold circuit has the output of the output amplifier connected to the inverting input of the input amplifier thereby placing the sample capacitor in a feedback loop during the sampling time when the sample switch is turned on. This circuit provides inverse feedback around the entire circuit. The output therefore follows the input when the sample switch is closed regardless of errors at the switch, at the capacitor, or at the output amplifier. However, offset in the input amplifier is not corrected by the loop.

Furthermore, the transistor sample switch has an internal value of capacitance between the switch control line and the switch terminals. When the control line makes the step change of voltage to turn the transistor switch off, a current from the capacitance formed between the control terminal and the output terminal flows into the sample capacitor (pumped charge) changing its charge and causing an error. This capacitance will change only if the terminal voltage changes.

The sample and hold circuit of this invention places the sample capacitor in the feedback loop as part of an integrating circuit with a nonlinear circuit at the output of the integrater, the overall combination providing a very wide range of input analog signal capability. Furthermore, minimal circuitry is added to compensate for any pumped charge error.

BRIEF SUMMARY OF THE INVENTION

An input differential amplifier receives a varying input analog signal. The output of the input differential amplifier charges a sample capacitor through a resistor and through a sample transistor switch when the transistor switch is closed. The sample capacitor is connected across the output of a differential amplifier and its inverting input, forming an integrater circuit. The output of this integrater circuit feeds into a nonlinear circuit which in turn is connected to the noninverting output of an output differential amplifier having unity gain and whose output forms a feedback path to the noninverting input of the input amplifier. The output is therefore held to the value of the input. The nonlinear circuit provides a fraction of the sample voltage across the sample capacitor to be applied to the noninverting input of the output amplifier in the presence of a small signal, gradually increasing to nearly the amplitude of the sample voltage for a large signal. This configuration allows a range of very small signals to relatively high signals to be faithfully sampled and held.

Also, a transistor switch identical to the transistor sample switch has its control terminal tied to the transistor sample switch control terminal and its output terminal connected to the noninverting input of the integrating differential amplifier and to a capacitor identical to the sample capacitor. Any pumped charge on the sample transistor switch will be equaled on the identical transistor switch so that both terminals of the integrating differential amplifier will be changed by an equal amount thereby eliminating any change in its output. Since the integrating circuit configuration forces the sample transistor switch output terminal to remain at a constant voltage (virtual ground), the pumped charge remains constant regardless of signal amplitudes.

The main object of this invention is to provide a sample and hold circuit having a very wide range of input voltage capability for sampling and holding voltages for use in floating point amplifiers.

Another object of this invention is to provide a floating point amplifier in which compensation is provided for pumped charge error from the transistor sample switch.

Still another object of this invention is to provide a floating point amplifier having the sample capacitor connected into an overall feedback circuit.

Another object of this invention is to provide a floating point amplifier having the feedback capacitor and a nonlinear network connected into an overall feedback path to increase the range of the input analog voltage capability.

These and other objects will be made evident in the detailed description that follows.

DETAILED DESCRIPTION OF THE INVENTION

The compound floating point amplifier disclosed herein combines the advantages of a predictive type amplifier, together with those of the binary gain amplifier in conjunction with a sample and hold circuit. The result of this combination is an amplifier that achieves the dynamic range of the predictive amplifier, but with a great reduction in the complexity of circuitry and cost.

Figure 1:
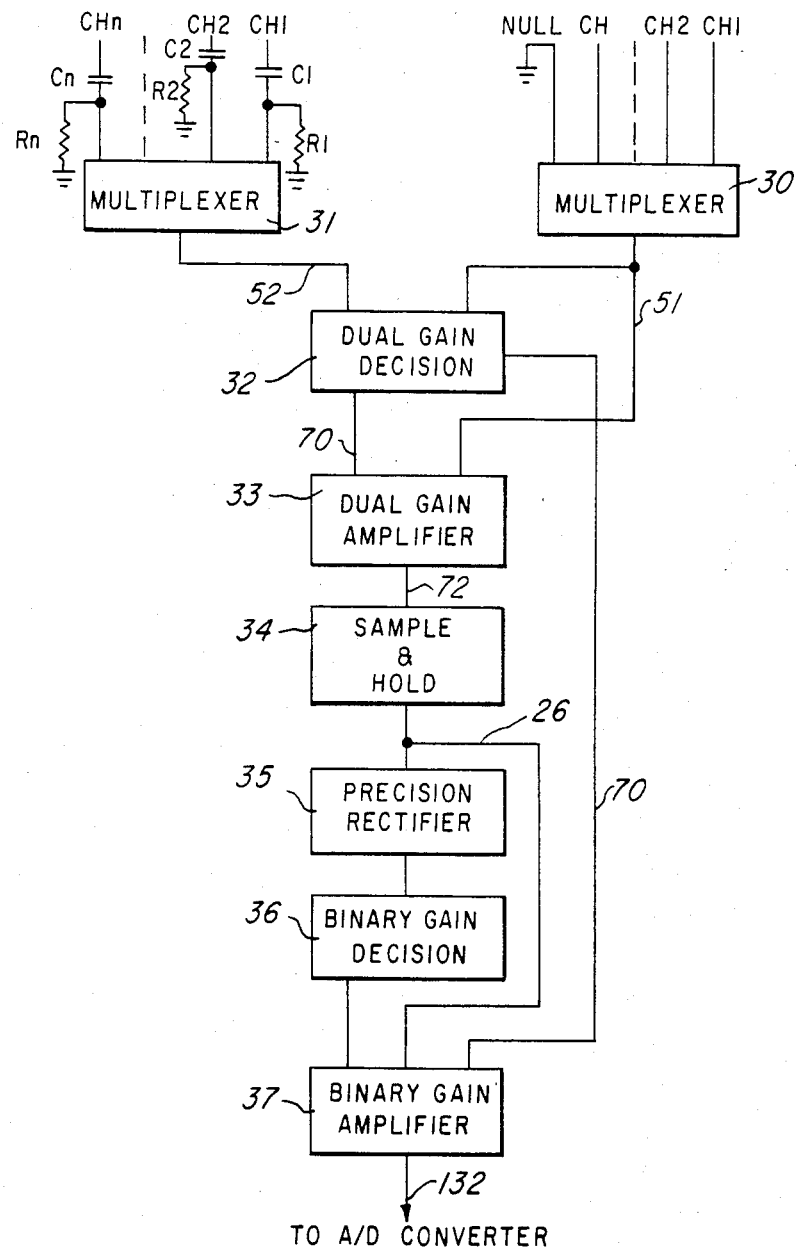
FIG. 1 is a block diagram of the compound floating point amplifier.

In FIG. 1, multiplexer 30 receives analog signals from various channels denoted as CH1, CH2, . . . CHn. Also shown is a NULL line connected to ground. Multiplexer 31 illustrates input analog signals from CH1, CH2, . . . Chn. Signal CH1 is connected to one terminal of capacitor C1 whose other terminal is connected to multiplexer 31 and through resistor R1 to ground. The other channels are connected in the same manner. As will be described, the resistor-capacitor (RC) combination provides a rate of change signal (slew rate) for the incoming analog signal. Multiplexers 30 and 31 are made up of CMOS switches which sequentially receive the analog signals from the channel inputs in a conventional manner. Multiplexers 30 and 31 operate in synchronization so that, for example, the channel 1 analog signal which is output on line 51, is present at exactly the same time as the rate of change (slew) signal is present on line 52, the output from multiplexer 31.

Referring again to capacitor C1 and resistor R1, it can be seen that this simple circuit provides a differentiator for the incoming signal. For this application, the reactance of capacitor C1 is many times greater than the resistance of resistor R1 and therefore the current in the circuit is determined almost entirely by capacitor C1. The current that charges the capacitor is equal to the capacity times the derivative (rate of change) of the voltage across the capacitor.

$$i = CdE/dt$$

In this case, the voltage E across the capacitor is essentially equal to the input voltage Ein so that:

$$i = CdEin/dt$$

The current "i" flows through the resistor R1, producing a voltage equal to: "ir". This is the output voltage, Eout.

$$Eout = iR = RCdEin/dt$$

$$dEin/dt = Eout/RC = \text{rate of change (slew rate)}$$

Thus the rate of change of the input voltage is the output voltage divided by the product of resistance and capacity. In this preferred embodiment, the capacitor C1 value is 0.0033 microfarads and the resistor R1 value is 1,000 ohms. The rate of change equals 0.03 Eout volts per microsecond. Capacitor C2 and resistor R2, and capacitor Cn and resistor Rn are identical to capacitors C1 and R1 in value and operate in exactly the same manner as described. Since the resistor and capacitor values in this application provide a cutoff frequency of approximately 4800 Hz and since most frequencies of interest in seismic work are below 100 Hz, the combination provides a very good differentiator.

When the appropriate multiplexer switches of multiplexers 30 and 31 are closed, the analog signal appears on line 51 and the slew rate corresponding to that analog signal appears on line 52, both of which are input to the dual gain decision circuit 32. In this preferred embodiment, depending upon the amplitudes of the slew rate signal and the analog signal, a decision is made for a gain of unity or a gain of 64 to be made. The dual gain decision signal on line 70 provides an input to dual gain amplifier 33 which then provides a unity gain amplification or an amplification of 64. The output from dual gain amplifier on line 72 is stored in sample and hold circuit 34. The output from sample and hold circuit 34 is applied, on line 26, to precision rectifier 35. Precision rectifier 35 is a full wave rectifier that provides a single polarity signal to the binary gain decision circuit 36. Binary gain decision circuit, based on the amplitude of the input signal from the precision rectifier circuit 35, decides on an amplification of from 1 to 256. The gain decision is sent, in binary form, to binary gain amplifier 37 which amplifies the signal from the sample and hold circuit as determined by the binary gain decision output. Binary gain amplifier 37 also provides a digital work indicative of the total gain, which is accomplished by providing the dual gain decision circuit output on line 70 to be added, in the binary gain amplifier circuit 37, to the binary gain decision output. The output of binary gain amplifier 37 goes out, on line 132, to an A/D converter (not shown). The digital work indicative of the total gain is used in an associated computer system to determine the actual amplitude of the incoming analog signal.

Figure 2:
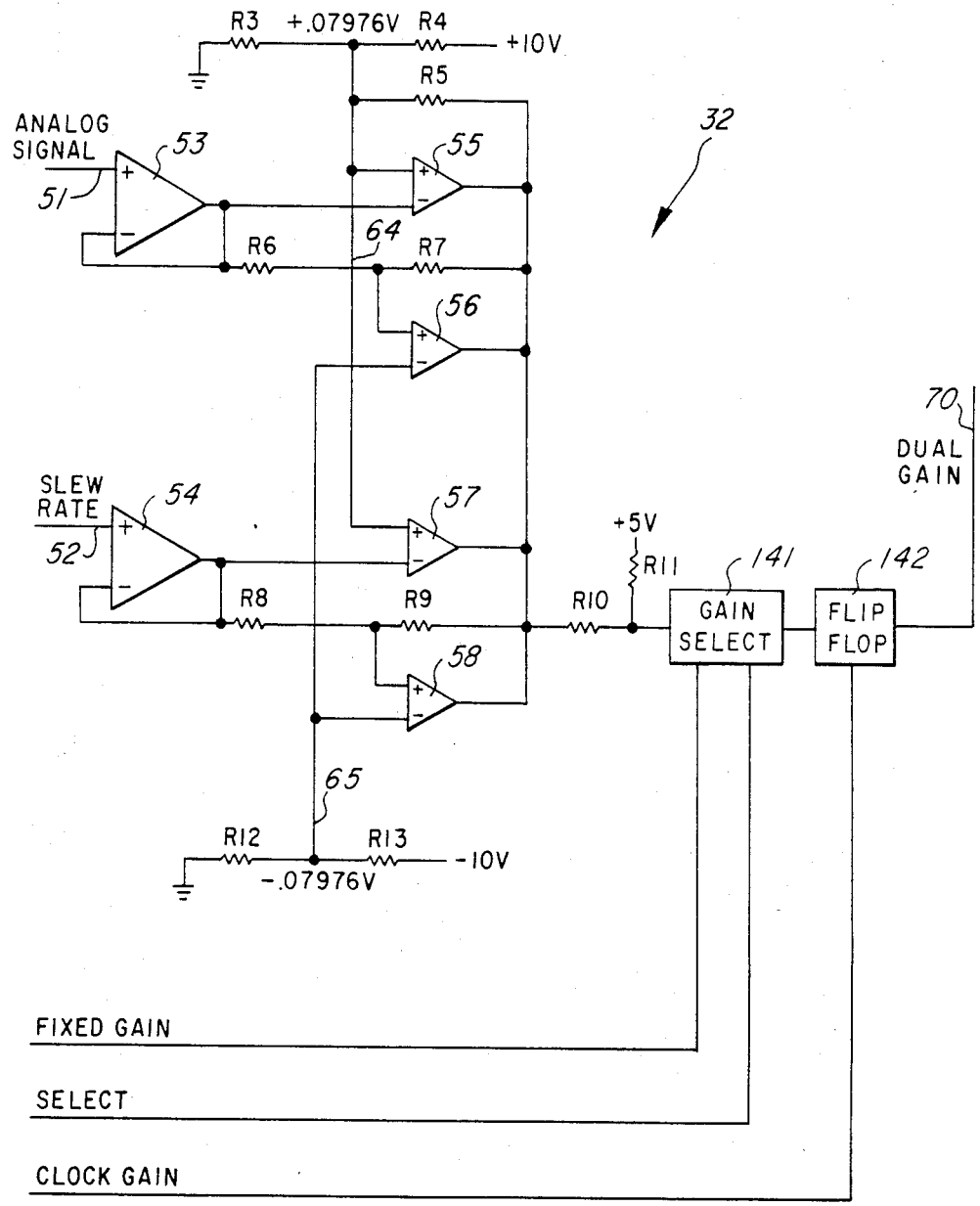
FIG. 2 is a schematic diagram of the dual gain decision circuit.

FIG. 2 illustrates the dual gain decision circuitry. The analog signal on line 51 provides one input to the non-inverting terminal of amplifier 53. The slew rate on line 52 provides one input to the non-inverting terminal of amplifier 54. The output of amplifier 53 provides an input to the inverting terminal of comparator 55. The output of amplifier 53 is connected to provide the inverting input to amplifier 53. This output is also impressed on the positive terminal of comparator 56, through resistor R6.

In the same manner, the output of amplifier 54 provides its inverting input, and an input to the inverting terminal of comparator 57. The output of amplifier 54 also, through resistor R8, is impressed on the non-inverting terminal of comparator 58. The outputs of comparators 55-58 are connected together and, through resistor R5, to the non-inverting inputs of comparators 55 and 57. Also, the outputs of these comparators are connected, through resistors R7 and R9, respectively, to the non-inverting inputs of comparators 56 and 58, respectively.

Resistors R4 and R3 divide a 10 volt reference down to +0.07976 volts, which is connected to the non-inverting inputs of comparators 55 and 57. Likewise, resistors R12 and R13 divide down a −10 volts to −0.07976 volts and apply that voltage to the inverting terminals of comparators 56 and 58. Comparators 55 and 57 compare for positive voltages. Comparators 56 and 58 compare for negative voltages. If the absolute voltage level of the output of either of amplifiers 53 or 54 is below 0.07976 volts, the appropriate comparator outputs will go high. The comparator outputs are connected through resistor R10 and through resistor R11 to +5 volts. When the output at the junction of resistors R10 and R11 is high, then a gain of 64 is indicated. However, if either amplifier 53 or 54 has an absolute level greater than 0.07976 volts, the appropriate pair of comparator outputs will be low, indicating that a unity gain should be made. It should be noted that the output levels of the pairs of comparatos may be subject to other thresholds and may be combined in different manners.

Gain select 141 is simply a CMOS gate that allows the output of the comparators or a fixed gain signal to be impressed on the next stage. External signals (from a computer or the like) may be represented as the fixed gain input and the select input. The gain select output, which is either the output from the comparators or the fixed gain, is applied as an input to flip flop 142. Flip flop 142 is gated out by the clock signal "CLOCK GAIN". This particular signal is provided by a clock circuit (not shown). The clock gain signal goes positive 19.53 microseconds after the appropriate switches of multiplexers 30 and 31 close. At this point, the dual gain indicator signal is sent out on line 70.

Figure 3:
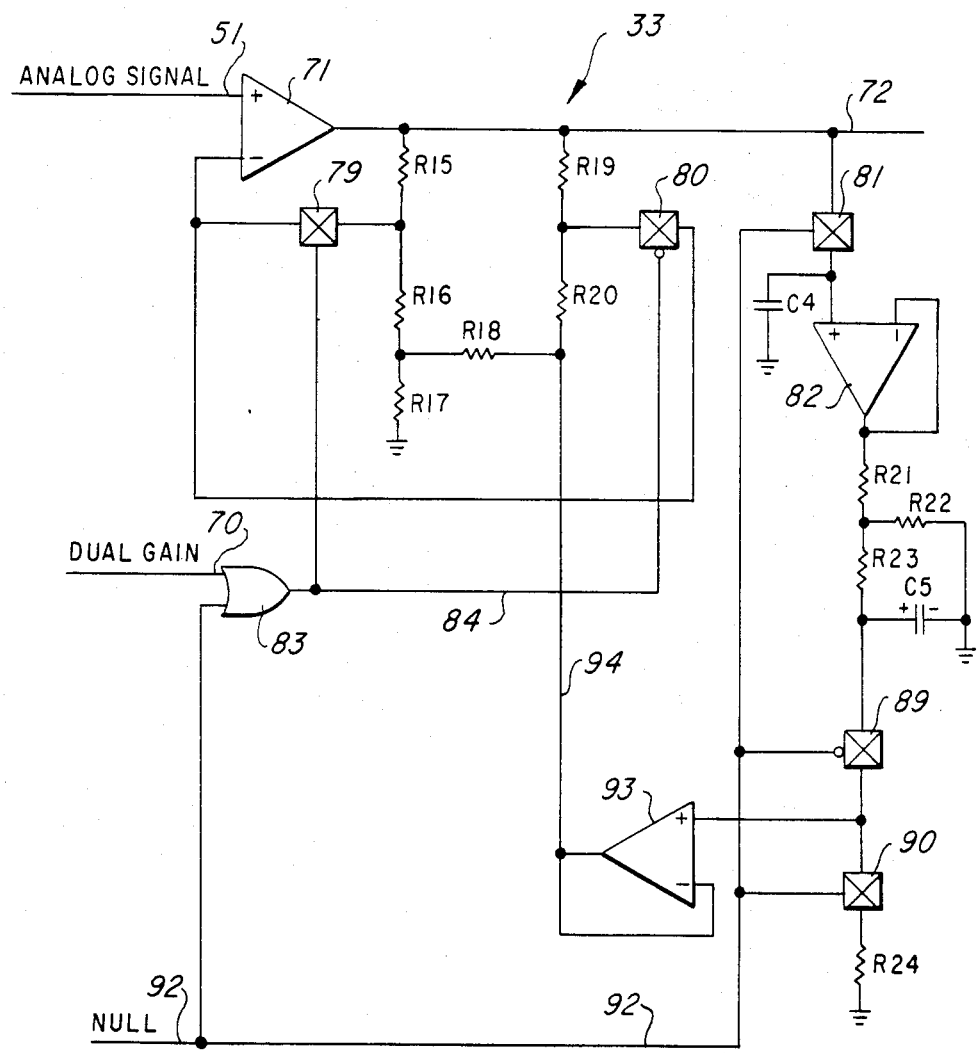
FIG. 3 is a schematic diagram of the dual gain amplifier.

The dual gain amplifier of FIG. 3 receives the analog signal 51 to the non-inverting input to amplifier 71. The dual gain input on line 70 is received by OR gate 83 whose other input is provided by NULL line 92. The output from amplifier 71 is connected to a voltage divider formed of resistors R15 and R16 and a voltage divider formed by resistors R19 and R20. Switch 79 has its one terminal connected between resistors R15 and R16, its control terminal connected to the output of OR gate 83, and its other terminal connected to the other input to amplifier 71. Switch 80 has one terminal connected between resistors R19 and R20, its negative control terminal connected to the output of OR gate 83, and its other terminal connected to the inverting input to amplifier 71. The other end of resistor R20 is connected to one end of resistor R18. The other end of resistor R16 is connected to the other end of resistor R18 and to one end of R17 which is connected to ground. When switch 80 is closed (by reason of a low output from OR gate 83), feedback divider resistors R19 and R20 provide a voltage through switch 80 to the inverting input of amplifier 71 whose output then represents a gain of 1.2. Resistors R15 and R16 and the parallel combination of resistors R17 and R18 form a feedback divider to provide a gain of 76.8 when switch 79 is closed. Switch 79 is closed and switch 80 is opened when the output of NOR gate 83 is high. The output of NOR gate 83 is high when either of lines 70 or 92 is high. The gain change ratio is 76.8/1.2=64. Of course an attenuation of 1.2 to 1 may be provided to make the gains 1 and 64, respectively.

The remainder of the circuit of FIG. 3 is DC offset correction. Switch 81 has one terminal connected to the output of amplifier 71, and has its other terminal connected to the non-inverting input to amplifier 82. The control terminal of switch 81 is connected to NULL line 92. Capacitor C4 is connected between the non-inverting terminal of amplifier 82 and ground. The output of amplifier 82 is fed back to its inverting terminal and also connected to one end of resistor R21. The other end of resistor R21 is connected through resistor R22 to ground and through resistor R23 to one terminal of switch 89. Capacitor C5 is connected to the one terminal of switch 89 and to ground. The other terminal of switch 89 is connected to terminal of switch 90 and to the non-inverting input to amplifier 93. The negated control terminal of switch 89 is connected to NULL line 92. The other terminal of switch 90 is connected through resistor R24 to ground. The control terminal for switch 90 is connected to NULL line 92.

When a controlling computer (not shown) places a high signal on NULL line 92, switches 81 and 90 are closed and switch 89 is opened. At the same time that the NULL line is made to go high, the input signal line 51 is grounded through the NULL line shown in association with multiplexer 30. The output of amplifier 71 then is the DC offset. This offset signal divided by the gain is the equivalent input DC offset. Switch 81, capacitor C4 and amplifier 82 form a sample and hold circuit. Capacitor C4 charges up to the DC level and holds this level after switch 81 is opened. Resistors R21 and R22 divide the DC down. Resistor R23, together with the parallel combination of resistors R21 and R22, and capacitor C5, form a filter to remove any noise. It is a relatively long time constant filter so that many cycles of operation are required to bring the charge on capacitor C5 to the level of the charge on capacitor C4. When the NULL line 92 is brought low, then switches 81 and 90 open and switch 89 closes. This applies the filtered DC offset through amplifier 93 to line 94. If the high gain connection has been made, then the DC offset is divided by resistors R18, R17, R16 and R15, to be exactly equal to the equivalent offset of amplifier 71. This voltage is impressed, through switch 79, to the inverting input of amplifier 71 to remove the offset.

If a connection is made for a low gain, then resistors R20 and R19 form the divider and provide exactly the same level as was provided through switch 80 so that the offset is eliminated.

When the NULL line 92 is high, switch 89 is opened and switch 90 is closed, connecting the non-inverting input of amplifier 93 to essentially ground. Any offset in amplifier 93 is impressed, through switches 79 or 80, to the inverting input of amplifier 71. Thus, any offset in amplifier 93 is included in the correction.

Figure 4:
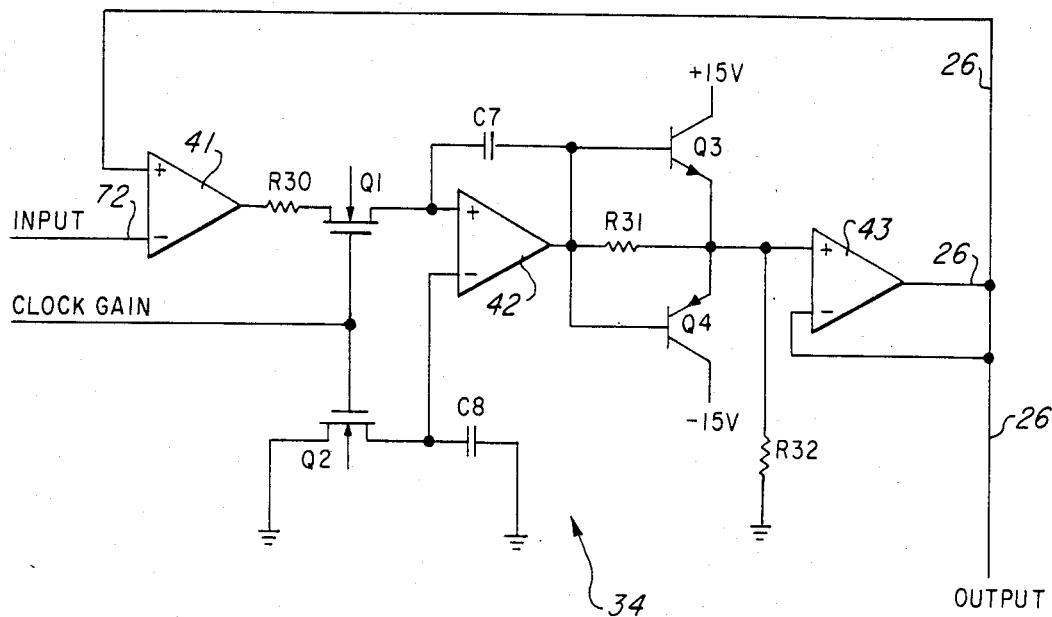
FIG. 4 is a schematic diagram of the sample and hold circuit.

FIG. 4 is a schematic diagram of the sample and hold circuit 34. This circuit is fully described and claimed in copending patent application Ser. No. 504,333 assigned to the assignee of this invention. The output of the dual gain amplifier 33 on line 72 is applied to the inverting input of amplifier 41. The output of amplifier 41 is applied, through resistor R30 to one terminal of field effect transistor Q1. The clock gain signal is applied to the gate of transistor Q1 and to the gate of an identical transistor Q2. Transistor Q2 has one terminal tied to ground and the other terminal tied to the noninverting input of amplifier 42 and, through capacitor C8, to ground. The other terminal of transistor Q1 is tied to the inverting output of amplifier 42. The output of amplifier 42 is tied back, through capacitor C7, to its inverting input. It also is tied, through resistor R31, to the noninverting input of amplifier 43. The output of amplifier 42 is connected to the bases of NPN transistor Q3 and PNP transistor Q4. The collectors of transistor Q3 and Q4 are tied to +15 volts and −15 volts, respectively, while their emitters are tied together and to the noninverting input of amplifier 43. Resistor R32 forms a divider with resistor R31, having one end connected to the noninverting input of amplifier 43 and the other end connected to ground. The output of amplifier 43 is tied to its inverting input and also, via line 26, to the noninverting input of amplifier 41.

Transistor Q1 has an internal value of capacitance between the clock gain control terminal and the input and output terminals. When the clock gain makes a step change of voltage to turn off transistor Q1, current from the capacitor formed between the gate and drain of transistor Q1 flows into capacitor C7, charging that capacitor to an improper value. To offset that error, transistor Q2 is added to the circuit so that any charge from its gate to drain capacitance is transferred to capacitor C8 which is connected to the noninverting input of amplifier 42. Therefore, both the inverting and noninverting inputs of amplifier 42 have equal charges applied and the output therefore remains unchanged.

With switch Q1 closed, amplifier 42 is an integrator. It feeds back through capacitor C7 to its inverting input. Capacitor C7 will charge and then hold the charge after switch Q1 opens. If the input signal level is low, neither transistor Q3 or Q4 will be turned on and the output of amplifier 42 will be directed through the voltage divider formed by resistor R31 and R32. In this preferred embodiment, the resultant voltage applied to the noninverting input of amplifier 43 produces an output voltage that is 1/11 of the voltage developed across capacitor C7. Because of the connection between the output of amplifier 43 and the input to amplifier 41, the charge across capacitor C7 will be 11 times the input voltage. Therefore at the low level end of the range, the range has been extended 11 to 1 (20.8 db).

When the input signal is sufficiently high in a positive direction, transistor Q3 will be turned on. When the input signal is sufficiently high in the negative direction, transistor Q4 will be turned on. When either of these emitter followers is turned on by higher voltages, the appropriate emitter follower current gain supplies the current into resistor R32. Under these circumstances, the output of amplifier 43 on line 26 will be essentially the same as the voltage charge across capacitor C7. As the signal level decreases, the impedance of the path through either of transistors Q3 or Q4, depending upon polarity, increases, dividing down the output from amplifier 42 as input to amplifier 43. This continues until the transistors present an open circuit at which time the 11 to 1 division is again effective.

The non-linear circuit at the output of amplifier 42 therefore provides an extended range (110 dB) without requiring a large range capability of capacitor C7.

Transistors Q3 and Q4 may be replaced by oriented diodes to provide another satisfactory embodiment of the sample and hold circuit.

Figure 5:
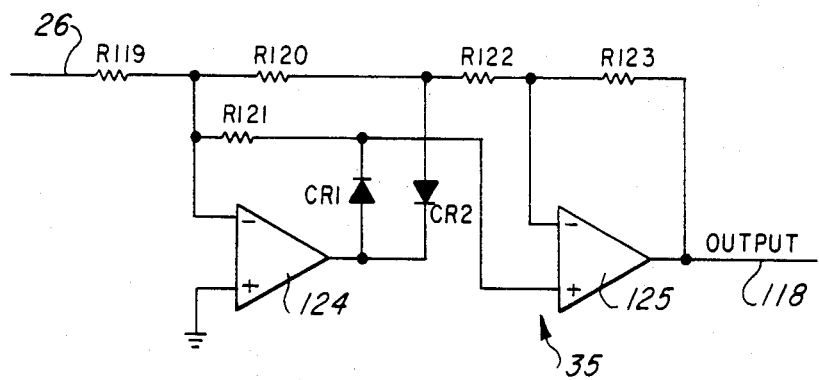
FIG. 5 is a schematic diagram of the full wave rectifier.

Precision rectifier 35 as shown in FIG. 5, receives the output from the sample and hold circuit 34 on line 26. Rectifying diodes CR1 or CR2, depending upon the polarity of the incoming signal, is included in a negative feedback loop to correct for the diode non-linearity. The five resistors, R119-R123 are all exactly equal (in this preferred embodiment 4.99k ohms). The input line 26 is connected to the inverting input of amplifier 124 through resistor R119. The noninverting input is grounded. The output of amplifier 124 is connected to the anode of diode CR1 and to the cathode of diode CR2. The cathode of diode CR1 is connected through resistor R121 to the inverting input of amplifier 124. The anode of diode CR2 is connected through resistor R120 to the inverting input of amplifier 124. The cathode of diode CR1 is also connected to the non-inverting input of amplifier 125. The anode of diode CR2 is connected, through resistor R122, to the inverting input of amplifier 125. The output of amplifier 125 is connected, through resistor R123, to its inverting input.

When the input signal on line 26 is positive, the output of amplifier 124 is negative, turning on diode CR2. This completes a feedback path through resistor R120 to the inverting input of amplifier 124. This input must be essentially zero, therefore, the current in resistor R120 must equal the current in resistor R119. The junction of resistors R120 and R122 must be negative and equal in amplitude to the input signal. Resistors R122, R123 and amplifier 125 form a unity gain inverting amplifier. Thus the output on line 118 is positive and equal to the input on line 26.

If the input is negative, the output of amplifier 124 is positive, turning on diode CR1. This completes a feedback path through resistor R121 to the inverting input of amplifier 124. The output of amplifier 124 then also provides an input to the noninverting input of amplifier 125. Therefore, amplifier 125 acts as a non-inverting amplifier with a gain of 3/2. The currents through resistors R123, R122 and R120, plus the current through resistor R121, must equal the current through resistor R119 so that the inverting input of amplifier 124 is at zero. The voltage across resistor 121 is positive and equal to ⅔ of the input voltage. The output of amplifier 125 is positive and equal to the input (⅔×3/2=1). The output is always positive and equal in amplitude to the input.

Figure 6:
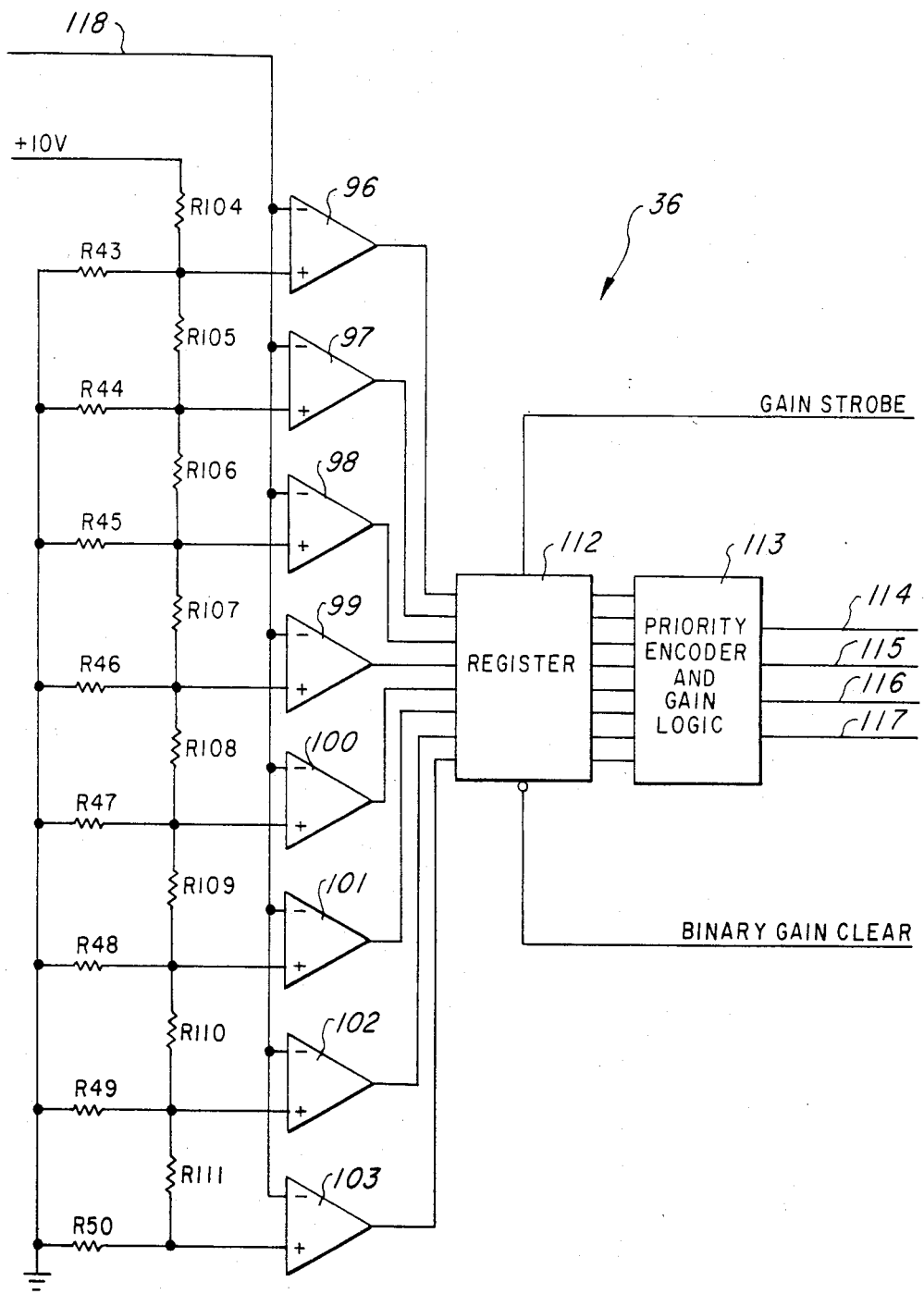
FIG. 6 is a schematic diagram of the binary gain decision circuit.

FIG. 6 is a schematic representation of the binary gain decision circuitry and receives the output from the precision full wave rectifier circuit 34 on line 118. Comparators 96-103 each have their inverting input connected to line 118. The non-inverting input of each of comparators 96-103 is connected to one end of each of resistors R43-R50, respectively, these resistors being tied together to ground at their other ends. +10 volts is divided down through resistors R104-R111. The connection between resistors R104 and R105 being connected to the positive input of comparator 96, the connection between resistors R105 and R106 is connected to the positive input to comparator 97, and so on. Resistors R43-R50 are twice the value of resistors R104-R111, respectively.

The outputs from each of comparators 96-103 are input to register 112 which is gated out by a clock signal on gain strobe line 140. The eight outputs from register 112 provide inputs to priority encoder and gain logic 113 which provides four outputs on lines 114-117. In this preferred embodiment, circuit 113 is a Motorola #14532 priority encoder and gain logic.

The 10 volt reference is divided down by the resistor ladder network made up of resistors R104-R111 and R43-R50 so that at the noninverting input of comparator 96, 2.97 volts is present. Each point on the ladder is ½ of the previous value. For example, the noninverting input of comparator 97 is at 1.48 volts, that of comparator 98 is at 0.74 volts. If the signal is less than 2.97 volts, the output of comparator 96 will be high, permitting a gain step from one to two in the following binary gain amplifier. If the signal is less than 1.48 volts, comparators 96 and 97 will both have high outputs, permitting a gain of four. If the signal is below 0.74 volts, the outputs of comparators 96, 97 and 98 will be high, permitting a gain of 8, etc. A maximum gain of 256 is permitted when all comparator outputs are high. This configuration, of course, is a design choice and it is contemplated that the gain could be more of less than in this preferred embodiment.

Circuit 113 provides logic so that when all the comparator outputs are low, lines 114-117 are all low, signifying a gain of one. When comparator 96 only is high, line 117 is high and all others are low, signifying a gain of two. When comparators 96 and 97 only are high, line 116 is high and all others are low, signifying a gain of four. When all comparator outputs are high, line 114 is high and all others are low, signifying a gain of 256. The circuit contains an overlap prevent. If the dual gain amplifier is set at 1, the binary gain is not allowed to go beyond 32. This eliminates the possibility that a gain of 64 could be achieved with a dual gain of one. A gain of 64 may be obtained only if the dual gain amplifier has a gain of 64.

Figure 7:
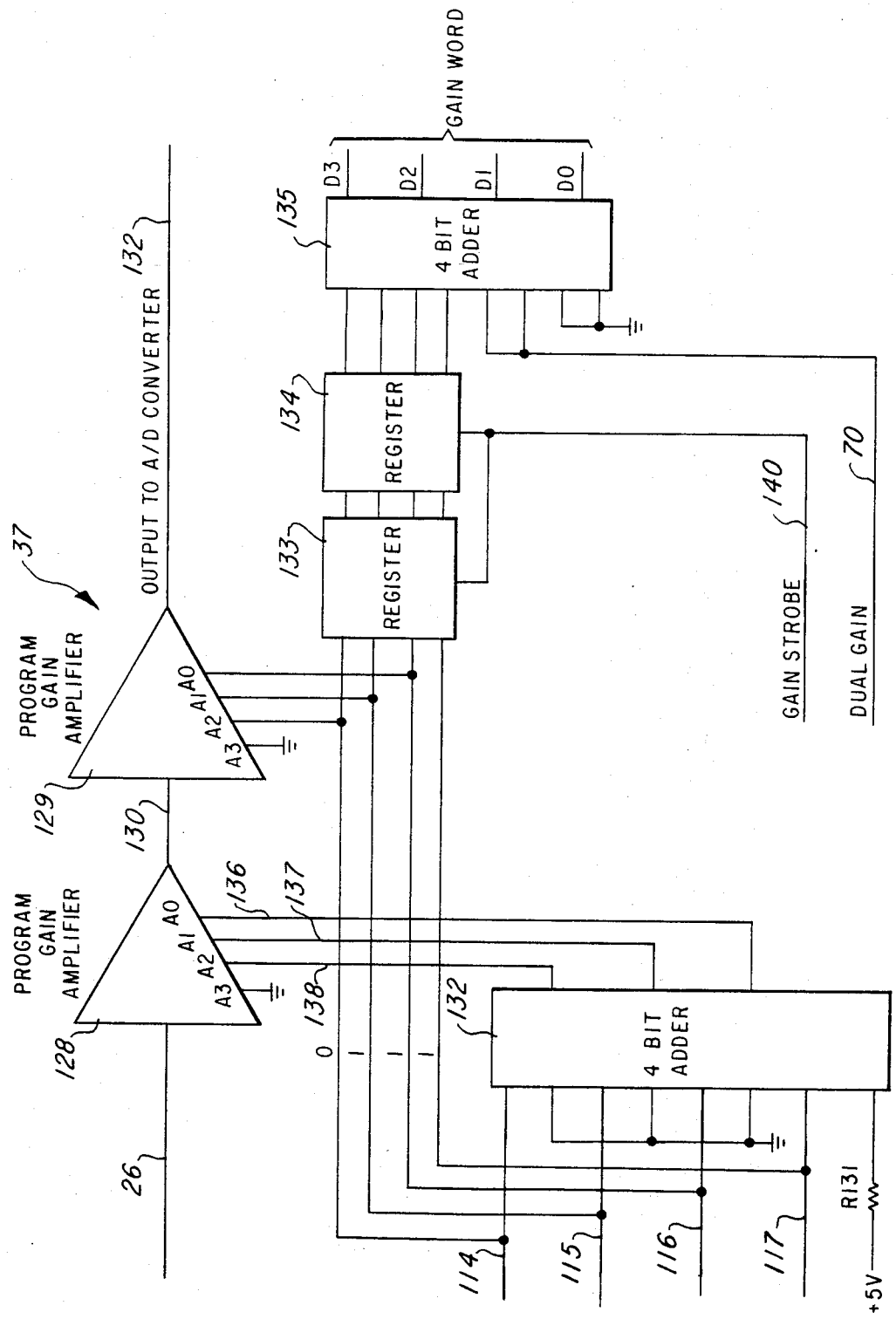
FIG. 7 is a schematic diagram of the binary gain amplifier.

Binary gain amplifier 37 shown in FIG. 7, receives the digital signals on lines 114–117 from the binary gain decision circuit 36. It also receives the output of the sample and hold circuit 34 on line 26. Line 26 provides an input to program gain amplifier 128 whose output provides an input to program gain amplifier 129. Amplifiers 128 and 129 are identical and are types MN2020 from Micro Network Company. Digital inputs on lines 114–117 provide a binary word input to four bit adder 132. Adder 132 and adder 135 are identical and in this preferred embodiment are Motorola type 14008. To the binary input to four bit adder 132 is added a "1" continuously by reason of the 5 volt input through resistor R131. The highest order three bits of the sum on lines 136, 137 and 138, are applied to program gain amplifier 128. Register 133 receives the digital input on lines 114–117. Lines 114–116 provide inputs to program gain amplifier 129. Register 133 provides an input to register 134 which in turn provides an input binary word to four bit adder 135. The other word to be added in register 135 comes from the dual gain output line 70 which, if high, (indicating a gain of 64) provides a 6 to be added to the digital word provided on lines 114–117. Output lines D0-D3 then provide a gain word indicating the total gain of the compound floating point amplifier.

As indicated, a four bit gain word controls the gain of each of amplifiers 128 and 129. In both cases, the input A3 is grounded. For each amplifier, the following table indicates the gain:

| A3 | A2 | A1 | A0 | GAIN |
|----|----|----|----|------|
| 0  | 0  | 0  | 0  | 1    |
| 0  | 0  | 0  | 1  | 2    |
| 0  | 0  | 1  | 0  | 4    |
| 0  | 0  | 1  | 1  | 8    |
| 0  | 1  | 0  | 0  | 16   |

MODE OF OPERATION

All of the figures should be referred to for an understanding of the mode of operation of this invention.

In this preferred embodiment, there are 12 channels. The number is, of course, a matter of selection and could be more or less. When the multiplexers 30 and 31 of FIG. 1 have selected one of the channels, for example, CH2, then a signal on CH2 is differentiated via RC combination R2 and C2, providing the slew rate. The signal on channel 1 is output from multiplexer 30 on line 51 and its slew rate is output from multiplexer 31 on line 52. These two signals provide inputs to the dual gain decision 32, shown in FIG. 2. Assume that both of these signals are less than 0.07976 volts. In that case, the outputs of comparators 55 and 57 will be high and an amplification of 64 will be indicated. If the two signals had been less than −0.07976 volts, then comparators 56 and 58 would have provided high outputs for the same result. If either input had been above the threshold of 0.07976 (negative or positive) the appropriate pair of comparators would have provided a net low output, thereby indicating a gain of unity.

Gain select 141, if selected with a fixed gain, may be used to override the requirement from this dual gain decision circuit. Assume that the fixed gain is not selected and therefore the decision to amplify by 64 is set into flip flop 142. Flip flop 142 is clocked by the signal "clock gain" from a clock source (not shown). In this preferred embodiment, the clock gain signal goes positive 19.53 microseconds after the switches of multiplexers 30 and 31 have closed to permit the channel 2 signal and slew rate into the system. On this leading edge, the gain decision is made.

The analog signal on line 51 from multiplexer 30 is input to the dual gain amplifier 33 of FIG. 3. Also input is the dual gain signal indicating the decision on line 70. If the dual gain line 70 indicates a gain of 64, switch 79 is closed and switch 80 is opened. The combination of divider resistors 15 and R16, together with divider resistors R17 and R18 provide an input through switch 79 to the inverting input of amplifier 71 to provide an output gain of 76.8. If dual gain line 70 indicates a unity gain, then switch 80 is closed and switch 79 is opened, with the divider network of resistors R19 and R20 providing an input to th inverting input of amplifier 71 so that a gain of 1.2 results. The gain change ratio then is 76.8/12=64, in this preferred embodiment. An attenuation of 1.2 to 1 may also be provided.

Sample and hold circuit 34 of FIG. 4 receives the amplified output on line 72 from the dual gain amplifier 33. The positive going edge of the clock gain signal that gated the gain decision from gain select circuit 141 into flip flop 142 may also be used to turn on FET transmistor Q1 (and transistor Q2). 19.53 microseconds later, the clock gain signal goes negative, turning off transistor Q1. This is the moment of sampling. As indicated above, the resistor network R31, R32 is used for low range signals, while either transistor Q3 or Q4 is employed for higher gain input signals. The non-linearlity of this combination of circuits provides for a very wide range of samples for the sample and hold circuit without a requirement for a high precision, wide range capacitor for the application of capacitor C7. The output sample on line 26 goes to both the precision recitifer 35 and the binary gain amplifier 37.

Precision rectifier 35 shown in FIG. 5 is a full wave rectifier having two amplifiers. Assuming that the input waveform on line 26 is positive, then the output of amplifier 124 is negative, turning on diode CR2, completing a feedback path through resistor 120 to the inverting input of amplifier 124. As indicated earlier, the junction of resistors R120 and R122 must be negative and equal in amplitude to the input. Resistors R122 and R123, and amplifier 125 form a unity gain inverting amplifier under those circumstances. The output on line 18 is therefore positive and equal to the input on line 26.

If the input on line 26 is negative, the output of amplifier 124 is positive, turning on diode CR1 which completes a feedback path through resistor R121 to the inverting input of amplifier 124.

The positive input to amplifier 125 then causes that amplifier to act as a non-inverting amplifier with a gain of 3/2. As indicated earlier, the currents through resistors R120, R122 and R123, plus the current through resistor R121 must equal the current through resistor R119. This can be the case only if the voltage across resistor 121 is positive and equal to ⅔ of the input. The output of amplifier 125 will be positive and equal to the input. The output is always positive and equal in amplitude to the input.

FIG. 6 is a binary gain decision circuit which comprises a flash A/D converter to set the correct gain level. This is accomplished by taking the input reference voltage and dividing it down by a binary ladder attenuator made up of resistors R104–R111 and R43–R50. A tap is provided on the ladder for each gain level. There are 8 taps for the 8 possible gain levels, in this preferred embodiment. Each comparator provides a decision for a gain step. If the signal level on line 118 is less than the attenuator step, a 2 to 1 gain increase is allowed. The comparator output goes to a priority encoder as a step in forming the gain value. The comparator outputs go to register 112 where they are clocked into register 140 by the gain strobe clock signal from a master clock (not shown) that occurs 23.4 microseconds after the sample switch opens. The comparators have had this time to settle before the binary gain decision is made. A binary gain clear line is provided to register 112 for the master clear by a controlling computer (not shown). The binary decision word on lines 114–117 provides the output from this circuit.

FIG. 7 receives the binary word in four bit adder 132 which then increases the word by one, providing the three most significant bits as inputs to the program gain amplifier 128. That amplifier will provide a gain in accordance with the table shown earlier. The binary word represented by lines 114–117 also enters register 133 where the next gain strobe pulse transfers its contents into register 134, which also is strobed by the next gain strobe pulse. Program gain amplifier 37 receives command inputs from a partial binary word of lines 114–116 and amplifies in accordance with the table shown earlier. The output from amplifier 129 is provided to an A/D converter. The output of register 134 is gated by the gain strobe signal into four bit adder 135 which adds 6 to the binary word present in the four bit adder from register 134, if there had been a 64 gain in the dual gain amplifier. The sum then represents the gain for the overall amplifier. If there had been a unity gain from the dual gain amplifier, then the 6 would not have been added.

The various values of gain and components, as well as the particular configurations are not deemed to be limiting. This invention is limited only by the appended claims.

What is claimed is:

1. An extended range sample and hold circuit for receiving a varying analog signal input, sampling the signal at a predetermined time and holding the sampled signal, comprising:
   (a) input means for receiving the varying analog signal input;
   (b) sample switch means, selectively operable to pass the varying analog signal when closed and to block the varying analog signal when opened at the predetermined time;
   (c) sample holding means connected to the sample switch means for holding an amplitude sample of the varying analog signal when the sample switch means is opened at the predetermined time;
   (d) output amplifier means having an output connected to the input means and also to provide the output for the sample and hold circuit; and
   (e) nonlinear circuit means connected to the output of the sample holding means and to the input of the output amplifier means for providing a signal to the output amplifier means that ranges from a proportional fraction of the amplitude sample to essentially the amplitude sample, depending upon the amplitude of amplitude sample.

2. The circuit of claim 1 wherein the input means comprises input amplifier means.

3. The circuit of claim 2 wherein the sample switch means comprises a sample transistor switch.

4. The circuit of claim 3 wherein the sample holding means comprises:
   (c)
   (i) integrating amplifier means having its input connected to the sample transistor switch; and
   (ii) a sample capacitor connected across the input and output of the integrating amplifier means for holding the amplitude sample.

5. The circuit of claim 4 wherein the integrating amplifier means comprises an integrating differential amplifier having its inverting input connected to the sample capacitor.

6. The circuit of claim 5 wherein a main electrode of the sample transistor switch is connected to the inverting input of the integrating differential amplifier further comprising:
   (g) second transistor switch means, identical to the sample transistor switch, having a main electrode connected to the noninverting input of the integrating differential amplifier; and
   (h) a pumped charge capacitor, connected to the noninverting input of the integrating differential amplifier and to the main electrode of the second transistor switch means, for receiving a charge identical to that received by the sample capacitor to change the voltage on the inverting and noninverting inputs of the integrating differential amplifier in equal amounts so that its output does not change.

7. The circuit of claim 5 wherein the input amplifier means comprises an input differential and the output amplifier means comprises an output differential amplifier, and wherein the output of the output differential amplifier is connected to its inverting input and also to the noninverting input of the input differential amplifier.

8. The circuit of claim 7 wherein the nonlinear circuit means comprises a voltage divider, tapped to connect to the noninverting input of the output differential amplifier, and a pair of oppositely oriented diodes, in parallel with each other and with the voltage divider.

9. The circuit of claim 7 wherein the nonlinear circuit means comprises a voltage divider, tapped to connect the noninverting input of the output differential amplifier, and a pnp transistor in parallel with an npn transistor and with the voltage divider.

10. The circuit of claim 9 wherein a main electrode of the sample transistor switch is connected to the inverting input of the integrating differential amplifier, further comprising:
   (g) a second transistor switch, identical to the sample transistor switch, having a main electrode connected to the noninverting input of the integrating differential amplifier; and
   (h) a pumped charge capacitor, connected to the noninverting input of the integrating differential amplifier and to the main electrode of the second transistor switch, for receiving a charge identical to that received by the sample capacitor, to change the voltage on the inverting and noninverting inputs of the integrating differential amplifier in equal amounts so that its output does not change.

11. A floating point amplifier for amplifying an analog signal for presentation to an analog-to-digital converter, comprising:
   (a) input means for receiving the analog signal;
   (b) sample switch means, selectively operable to pass the analog signal when closed and to block the analog signal when opened at a predetermined time;
   (c) sample holding means, connected to the sample switch means, for holding an amplitude sample of the analog signal when the sample switch means is opened at the predetermined time;
   (d) output amplifier means having an output connected to the input means;
   (e) nonlinear circuit means, connected to the output of the sample holding means and to the input of the output amplifier means, for providing a signal to the output amplifier means that ranges from a proportional fraction of the amplitude sample to essentially the amplitude sample, depending upon the amplitude of the amplitude sample; and
   (f) binary gain amplifying means for receiving the output of the sample and hold means, for modifying the gain of the binary gain amplifying means in response to the output of the sample and hold means.

12. The floating point amplifier of claim 11 wherein the input means comprises input amplifier means.

13. The floating point amplifier of claim 12 wherein the sample switch means comprises sample transistor switch.

14. The floating point amplifier of claim 13 wherein the sample holding means comprises:
   (c) (i) integrating amplifier means having its input connected to the sample transistor switch; and
   a sample capacitor connected across the input and output of the integrating amplifier means for holding the amplitude sample.

15. The floating point amplifier of claim 14 wherein the integrating amplifier means comprises an integrating differential amplifier having its inverting input connected to the sample capacitor.

16. The floating point amplifier of claim 15 wherein a main electrode of the sample transistor switch means is connected to the inverting input of the integrating differential amplifier further comprising:
   a second transistor switch, identical to the sample transistor switch, having a main electrode connected to the noninverting input of the integrating differential amplifier; and
   a pumped charge capacitor, connected to the noninverting input of the integrating differential amplifier and to the main electrode of the second transistor switch, for receiving a charge identical to that received by the sample capacitor, to change the voltage on the inverting and noninverting inputs of the integrating differential amplifier in equal amounts so that its output does not change.

17. The floating point amplifier of claim 15 wherein the input amplifier means comprises an input differential amplifier and the output amplifier means comprises an output differential amplifier, and wherein the output of the output differential amplifier is connected to its inverting input and to the noninverting input of the input differential amplifier.

18. The floating point amplifier of claim 17 wherein the nonlinear circuit means comprises a voltage divider, tapped to connect to the noninverting input of the output differential amplifier, and a pair of oppositely oriented diodes in parallel with each other and with the voltage divider.

19. The floating point amplifier of claim 17 wherein the nonlinear circuit means comprises a voltage divider, tapped to connect to the noninverting input of the output differential amplifier, and a pnp transistor in parallel with an npn transistor, and the voltage divider.

20. The floating point amplifier of claim 19 wherein a main electrode of the sample transistor switch is connected to the inverting input of the integrating differential amplifier, further comprising:
   a second transistor switch, identical to the sample transistor switch, having a main electrode connected to the noninverting input of the integrating differential amplifier; and
   a pumped charge capacitor, connected to the noninverting input of the integrating differential amplifier and to the main electrode of the second transistor switch means, for receiving a charge identical to that received by the sample capacitor, to change the voltage on the inverting and noninverting inputs of the sample differential amplifier in equal amounts so that its output does not change.

* * * * *